(12) United States Patent
Wang et al.

(10) Patent No.: US 12,394,739 B2
(45) Date of Patent: Aug. 19, 2025

(54) SEMICONDUCTOR PACKAGE AND METHOD OF MANUFACTURING SEMICONDUCTOR PACKAGE

(71) Applicant: CHANGXIN MEMORY TECHNOLOGIES, INC., Anhui (CN)

(72) Inventors: Luguang Wang, Hefei (CN); Jinrong Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 613 days.

(21) Appl. No.: 17/846,114

(22) Filed: Jun. 22, 2022

(65) Prior Publication Data

US 2023/0223371 A1    Jul. 13, 2023

Related U.S. Application Data

(62) Division of application No. PCT/CN2022/077782, filed on Feb. 24, 2022.

(30) Foreign Application Priority Data

Jan. 12, 2022 (CN) .................. 202210033878.X

(51) Int. Cl.
H01L 23/00 (2006.01)

(52) U.S. Cl.
CPC .............. *H01L 24/16* (2013.01); *H01L 24/81* (2013.01); *H01L 2224/16145* (2013.01); *H01L 2224/81895* (2013.01)

(58) Field of Classification Search
CPC ............. H01L 24/16; H01L 24/81; H01L 2224/16145; H01L 2224/81895; H01L 24/03; H01L 24/05; H01L 24/80

USPC ........................................ 257/737
See application file for complete search history.

(56) References Cited

U.S. PATENT DOCUMENTS

| 10,319,693 B2 | 6/2019 | Lambert |
| 2006/0121690 A1 | 6/2006 | Pogge et al. |
| 2007/0145553 A1* | 6/2007 | Araki ............... H01L 24/11 |
| | | 257/E23.021 |

(Continued)

FOREIGN PATENT DOCUMENTS

| CN | 1708840 A | 12/2005 |
| CN | 105097777 A | 11/2015 |

(Continued)

*Primary Examiner* — Fernando L Toledo
*Assistant Examiner* — Laura M Dykes
(74) *Attorney, Agent, or Firm* — Syncoda LLC; Feng Ma

(57) ABSTRACT

A semiconductor structure and a method for manufacturing a semiconductor structure are provided. The semiconductor structure includes: a first base with a first surface, in which a conductive pillar is arranged in the first base, the first surface includes a first groove, and the first groove exposes a top surface and a portion of a sidewall of the conductive pillar; a second base with a second surface, in which the first surface is bonded to the second surface, the second surface includes a second groove, an electrical connection pillar is arranged in the second base, the electrical connection pillar is located in the second groove, and the electrical connection pillar protrudes from the second surface; and an electrical connection structure, in which the electrical connection structure and a portion of the electrical connection pillar are embedded into the first groove.

18 Claims, 5 Drawing Sheets

(56) References Cited

U.S. PATENT DOCUMENTS

| | | | |
|---|---|---|---|
| 2013/0292823 A1 | 11/2013 | Chapelon | |
| 2015/0054140 A1 | 2/2015 | Chapelon | |
| 2015/0162292 A1* | 6/2015 | Machida | H01L 24/11 257/737 |
| 2015/0287687 A1 | 10/2015 | Farrens et al. | |
| 2015/0364441 A1 | 12/2015 | Lambert | |
| 2017/0011948 A1 | 1/2017 | Farrens et al. | |
| 2017/0141065 A1* | 5/2017 | Murai | H01L 24/14 |
| 2017/0186724 A1 | 6/2017 | Chylak et al. | |
| 2020/0013745 A1* | 1/2020 | Lee | H01L 24/09 |
| 2020/0243467 A1 | 7/2020 | Prevatte et al. | |
| 2021/0217703 A1 | 7/2021 | Chuang et al. | |
| 2022/0189822 A1 | 6/2022 | Wang et al. | |

FOREIGN PATENT DOCUMENTS

| | | |
|---|---|---|
| CN | 108573883 A | 9/2018 |
| CN | 111081646 A | 4/2020 |
| CN | 111199946 A | 5/2020 |
| CN | 111326503 A | 6/2020 |
| CN | 111785646 A | 10/2020 |
| CN | 112117249 A | 12/2020 |
| CN | 112456436 A | 3/2021 |
| CN | 112614807 A | 4/2021 |
| CN | 112670191 A | 4/2021 |
| CN | 112670249 A | 4/2021 |
| CN | 112802757 A | 5/2021 |
| JP | 2014143305 A | 8/2014 |

\* cited by examiner

SEMICONDUCTOR PACKAGE AND METHOD OF MANUFACTURING SEMICONDUCTOR PACKAGE

CROSS-REFERENCE TO RELATED APPLICATIONS

This is a continuation application of International Patent Application No. PCT/CN2022/077782, filed on Feb. 24, 2022, which claims priority to Chinese Patent Application No. 202210033878.X, filed on Jan. 12, 2022 and entitled "SEMICONDUCTOR STRUCTURE AND METHOD FOR MANUFACTURING SEMICONDUCTOR STRUCTURE". The disclosures of International Patent Application No. PCT/CN2022/077782 and Chinese Patent Application No. 202210033878.X are incorporated by reference herein in their entireties.

BACKGROUND

With the development of three-dimensional packaging technology, multilayer stack packaging technology is widely used. However, a multilayer stack structure needs to use wafers with the same dimension for stacking. A connection structure between wafers occupies a certain thickness of the multilayer stack structure, so that the overall thickness of the multilayer stack structure is increased, which fails to meet current requirements for making the terminals thinner and thinner.

In addition, with the continuous reduce of integration, the dimension of a connection structure in the multilayer stack structure becomes smaller and smaller, and the distance between adjacent connection structures continues to reduce, which is easy to cause short circuits between adjacent connection structures and peeling between wafers.

SUMMARY

Embodiments of the disclosure relate to, but are not limited to, a semiconductor structure and a method for manufacturing a semiconductor structure.

According to some embodiments of the disclosure, an aspect of the embodiments of the disclosure provides a semiconductor structure, which includes: a first base with a first surface, in which a conductive pillar is arranged in the first base, the first surface includes a first groove, and the first groove exposes a top surface and a portion of a sidewall of the conductive pillar; a second base with a second surface, in which the first surface is bonded to the second surface, the second surface includes a second groove, an electrical connection pillar is arranged in the second base, the electrical connection pillar is located in the second groove, and the electrical connection pillar protrudes from the second surface; and an electrical connection structure, in which the electrical connection structure and a portion of the electrical connection pillar are embedded into the first groove, and the electrical connection structure surrounds at least a portion of the conductive pillar exposed from the first groove and the portion of the electrical connection pillar embedded into the first groove.

According to some embodiments of the disclosure, another aspect of the embodiments of the disclosure further provides a method for manufacturing a semiconductor structure, which includes the following operations. A first base with a first surface is provided, in which a conductive pillar is arranged in the first base, the first surface includes a first groove, and the first groove exposes a top surface and a portion of a sidewall of the conductive pillar. A second base with a second surface is provided, in which the second surface includes a second groove. An electrical connection pillar is formed in the second groove. An initial electrical connection structure is formed on a side of the electrical connection pillar away from the second base. The second surface including the electrical connection pillar and the initial electrical connection structure is bonded to the first surface, so as to embed the initial electrical connection structure and a portion of the electrical connection pillar into the first groove and to form an electrical connection structure.

BRIEF DESCRIPTION OF THE DRAWINGS

One or more embodiments are exemplarily explained through the figures in accompanying drawings corresponding thereto, these exemplary explanations do not constitute a limitation of the embodiments, elements having the same reference numerals in the accompanying drawings are denoted as similar elements, and unless otherwise specifically declared, the figures in the accompanying drawings do not constitute a limitation of proportion. In order to describe the technical solutions in embodiments of the disclosure or conventional technologies more clearly, the accompanying drawings required to be used in the embodiments of the disclosure will be simply introduced below. Apparently, the accompanying drawings in the following description show merely some embodiments of the disclosure, and a person of ordinary skill in the art may still derive other drawings from these accompanying drawings without creative effort.

DETAILED DESCRIPTION

Figure 1:
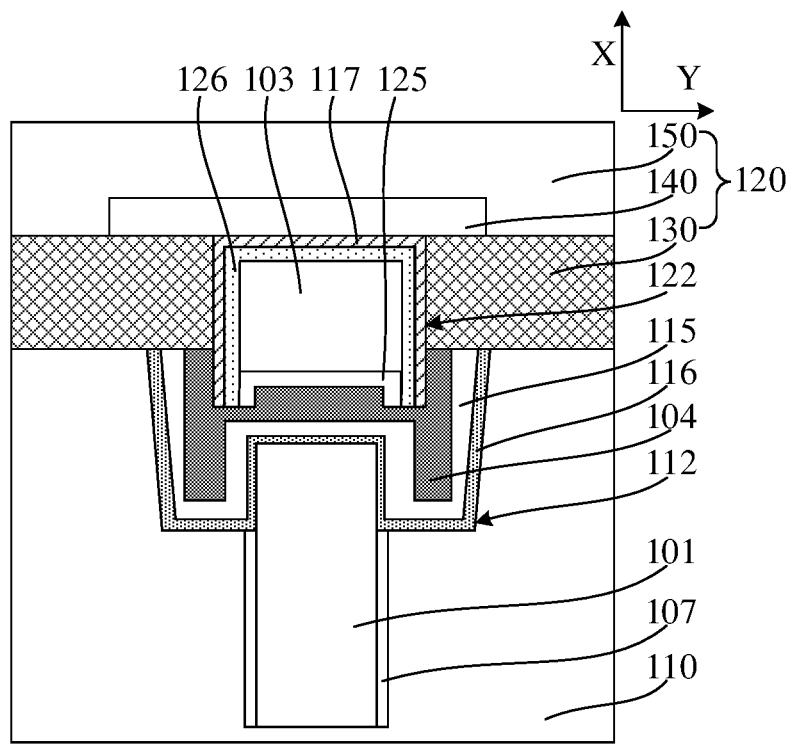
FIG. 1 to FIG. 14 are schematic diagrams of a structure corresponding to each operation in a method for manufacturing a semiconductor structure according to an embodiment of the disclosure.

The thickness of a multilayer stack structure needs to be reduced, and the stability of connection of the multilayer stack structure needs to be improved.

It is found through analysis that in the current stack base packaging technology, a TCB-NCP thermo compression bonding process is usually used. Thermo Compression Bonding (TCB) utilizes heat and pressure to perform welding at the connection structure between two adjacent bases, so as to realize the connection between the adjacent bases. The Non Conduction Paste (NCP) cooperates with the TCB process. That is, the NCP is applied between two bases. The NCP is used as a filling material to fill a gap between the two bases and wraps the connection structure protruding from the base.

However, due to the special fluidity of the NCP material, a process with sufficient intensity cannot be performed on the connection structure. The force applied on the form of the connection structure is easily deflected, so that the connection between adjacent bases becomes unstable. In addition, since the force applied on the form of the connection structure is easily deflected, the form of the connection structure is prone to abnormality, which may cause misalignment of the connection between the bases to reduce the signal transfer efficiency between adjacent bases, and which may cause short circuit due to contact between adjacent connection structures. In addition, since the NCP material is added between the bases, the overall thickness of the stack bases is increased, which fails to meet the current requirements for making the terminals thinner and thinner.

Embodiments of the disclosure provide a semiconductor structure and a method for manufacturing a semiconductor structure. In the semiconductor structure, the electrical connection structure and a portion of the electrical connection pillar located in the second base are collectively embedded into the first groove of the first base, so that the first base and the second base are in an engaged state. When the first base and the second base tend to move relative to each other, it is beneficial to prevent the first base and the second base from sliding relative to each other, thereby improving the stability of the connection between the first base and the second base. Moreover, the electrical connection structure surrounds at least a portion of the conductive pillar exposed from the first groove and a portion of the electrical connection pillar embedded into the first groove, which is beneficial to increase contact areas between the electrical connection structure and the conductive pillar as well as the electrical connection pillar, thereby ensuring good signal transfer efficiency between the first base and the second base. Furthermore, compared with the fact that a non-conduction paste is currently used to realize the connection between the first base and the second base, it is not necessary to add an additional non-conduction paste layer, which is beneficial to reduce material consumption and reduce the overall thickness of the stack bases.

Hereinafter, the respective embodiments of the disclosure will be described in detail in connection with the accompanying drawings. However, those of ordinary skill in the art may understand that, in the respective embodiments of the disclosure, numerous technical details are set forth in order to provide a reader with a better understanding of the embodiments of the disclosure. However, the technical solutions claimed in the embodiments of the disclosure can be implemented without these technical details and various changes and modifications based on the respective embodiments below.

An embodiment of the disclosure provides a semiconductor structure. The semiconductor structure provided in the embodiment of the disclosure is described below in detail with reference to the accompanying drawings. FIG. 1 is a schematic diagram of a semiconductor structure according to an embodiment of the disclosure.

With reference to FIG. 1, the semiconductor structure includes: a first base 110 with a first surface, in which a conductive pillar 101 is arranged in the first base 110, the first surface includes a first groove 112, and the first groove 112 exposes a top surface and a portion of a sidewall of the conductive pillar 101; a second base 120 with a second surface, in which the first surface is bonded to the second surface, the second surface includes a second groove 122, an electrical connection pillar 103 is arranged in the second base 120, the electrical connection pillar 103 is located in the second groove 122, and the electrical connection pillar 103 protrudes from the second surface; and an electrical connection structure 104, in which the electrical connection structure 104 and a portion of the electrical connection pillar 103 are embedded into the first groove 112, and the electrical connection structure 104 surrounds at least a portion of the conductive pillar 101 exposed from the first groove 112 and the portion of the electrical connection pillar 103 embedded into the first groove 112.

The first groove 112 is recessed from the first surface of the first base 110 toward the first base 110. The second groove 122 is recessed from the second surface of the second base 120 toward the second base 120. An orthographic projection of the second groove 122 on a surface of the first base 110 is located in an orthographic projection of the first groove 112 on the surface of the first base 110. In this way, it is beneficial to use the first groove 112 to accommodate the electrical connection structure 104 and the electrical connection pillar 103 protruding from the second base 120.

In some embodiments, the second base 120 includes a dielectric layer 130, a conductive layer 140, and a substrate 150. The second groove 122 penetrates through the dielectric layer 130. The dielectric layer 130 is configured to protect the substrate 150 and the conductive layer 140, so as to prevent the substrate 150 and the conductive layer 140 from contacting the unnecessary structures, thereby avoiding adverse impact on the performance of the semiconductor structure. The conductive layer 140 is located in the substrate 150, and the second groove 122 exposes a portion of the surface of the conductive layer 140. The conductive layer 140 is configured to realize the electrical connection between the electrical connection pillar 103 and other electrical devices in the second base. It should be noted that the situation that the second groove 122 only penetrates through the dielectric layer 130 is taken as an example in FIG. 1. In practical applications, the second groove 122 may also penetrate through a portion of the thickness of the conductive layer 140.

In some embodiments, the material of the dielectric layer 130 may be an insulating material with a relatively high relative dielectric constant, such as silicon oxide, silicon nitride or silicon oxynitride. The material of the conductive layer 140 may be a conductive material, such as aluminum, silver or gold. The material type of the substrate 150 may be an elemental semiconductor material or a crystalline inorganic compound semiconductor material. The elemental semiconductor material may be silicon or germanium. The crystalline inorganic compound semiconductor material may be silicon carbide, silicon germanium, gallium arsenide, or indium gallium.

In some embodiments, with reference to FIG. 1, an isolation layer 107 is arranged between the conductive pillar 101 and the first base 110. The material of the conductive pillar 101 may be copper. The material of the isolation layer 107 may be silicon oxide.

In some embodiments, in a plane perpendicular to a direction X from the first surface to the second surface, a cross-sectional area of the electrical connection pillar 103 is greater than a cross-sectional area of the conductive pillar 101. In this way, when the first base 110 and the second base 120 are stacked on one another, even if there is a certain deviation between the central axis of the conductive pillar 101 and the central axis of the electrical connection pillar 103, it can still be ensured that an orthographic projection of the conductive pillar 101 on the first surface completely falls within an orthographic projection of the electrical connection pillar 103 on the first surface, which is beneficial to improve the alignment accuracy between the electrical connection pillar 103 and the conductive pillar 101.

In some embodiments, a ratio of the cross-sectional area of the electrical connection pillar 103 to the cross-sectional area of the conductive pillar 101 ranges from 2 to 5. In this way, while ensuring that the dimension of the conductive pillar 101 is relatively small and does not occupy excessive space in the first base 110, it can ensure that the dimension of the electrical connection pillar 103 is not excessively large, thereby avoiding the electrical connection pillar 103 from occupying excessive space in the second base 120. In addition, the ratio of the cross-sectional area of the electrical connection pillar 103 to the cross-sectional area of the conductive pillar 101 is greater than 2, which is beneficial to ensure relatively high alignment accuracy between the electrical connection pillar 103 and the conductive pillar 101.

In some embodiments, in a direction Y perpendicular to the direction X from the first surface to the second surface, a ratio of a width of the first groove 112 to a width of the conductive pillar 101 ranges from 2 to 3. In this way, it is beneficial to completely fill the space in the first groove 112 that is not occupied by the conductive pillar 101 with the electrical connection structure 104 and the electrical connection pillar 103 protruding from the second base 120. It should be noted that the ratio of the width of the first groove 112 to the width of the conductive pillar 101 may be adjusted according to the overall volume of the electrical connection structure 104 and the electrical connection pillar 103 protruding from the second base 120 which need to be accommodated in the first groove 112.

In some embodiments, with reference to FIG. 1, the electrical connection structure 104 is located between the electrical connection pillar 103 and the conductive pillar 101. That is, a cross-sectional shape of the electrical connection structure 104 in a plane formed by the direction X and the direction Y is similar to an "H" shape. In other embodiments, the electrical connection structure may surround only the sidewall of the conductive pillar exposed from the first groove and surround the sidewall of the electrical connection pillar embedded into the first groove.

In some embodiments, with reference to FIG. 1, the semiconductor structure may further include a first protection layer 115 located between the electrical connection structure 104 and a surface collectively formed by the conductive pillar 101 and the first groove 112. In this way, the first protection layer 115 may be used to prevent the conductive pillar 101 exposed from the first groove 112 from being oxidized.

In some embodiments, the material of the conductive pillar 101 may be copper. The material of the first protection layer 115 may be nickel. The material of the electrical connection structure 104 may be a silver-tin alloy. Since the lattice constant of nickel is relatively close to the lattice constant of the silver-tin alloy, nickel may be closely connected to the silver-tin alloy. That is, the contact performance between the electrical connection structure 104 and the first protection layer 115 is good, which is beneficial to reduce the interface resistance between the electrical connection structure 104 and the first protection layer 115. In addition, the contact between the electrical connection structure and the first protection layer will not generate a relatively large stress, which is beneficial to further improve the stability of the connection between the electrical connection structure 104 and the first protection layer 115.

In some embodiments, with reference to FIG. 1, the semiconductor structure may further include a first seed layer 116 located between the first protection layer 115 and the surface collectively formed by the conductive pillar 101 and the first groove 112. The material of the first seed layer 116 may be copper. The material of the first protection layer 115 may be a metal material, such as nickel, gold or silver. The material type of the first base 110 may be an elemental semiconductor material or a crystalline inorganic compound semiconductor material. Since there is a relatively large difference between the lattice constant of the semiconductor material and the lattice constant of the metal material, the lattice arrangement of the metal layers directly formed on the surface of the semiconductor material is inconsistent, resulting in insufficient quality of the formed metal layers and relatively high internal stress.

Therefore, since both the first seed layer 116 and the first protection layer 115 are made of a metal material, the lattice constant of the first protection layer 115 is highly matched with the lattice constant of the first seed layer 116, which is beneficial to reduce the defect density in the first protection layer 115, improve the film layer quality of the first protection layer 115, and reduce the internal stress of the first protection layer 115. Therefore, it is beneficial to improve the adhesion between the first seed layer 116 and the first base 110 as well as the first protection layer 115, thereby eventually improving the stability of the connection between the first base 110 and the second base 120.

In some embodiments, the thickness of the first seed layer 116 may range from 50 nm to 100 nm.

In some embodiments, with reference to FIG. 1, the semiconductor structure may further include a diffusion barrier layer 117 located between an inner surface of the second groove 122 and the electrical connection pillar 103. A top surface of the diffusion barrier layer 117 is higher than a top surface of the electrical connection pillar 103. The diffusion barrier layer 117 may prevent the elements in the electrical connection pillar 103 from diffusing into the second base 120 through the second groove 122, so as to avoid affecting the performance of the second base 120. In some examples, the material of the diffusion barrier layer 117 may be titanium. The material of the electrical connection pillar 103 may be copper.

In some embodiments, with reference to FIG. 1, the semiconductor structure may further include a second seed layer 126 located between the diffusion barrier layer 117 and the electrical connection pillar 103. A top surface of the second seed layer 126 is not higher than the top surface of the diffusion barrier layer 117. The second seed layer 126 helps to improve the stability of the connection between the diffusion barrier layer 117 and the electrical connection pillar 103.

In some embodiments, the top surface of the electrical connection pillar 103 and a portion of the diffusion barrier layer 117 which is not in contact with the electrical connection pillar 103 are configured to form a third groove (not shown in the figure) for accommodating the electrical connection structure 104.

In some embodiments, the semiconductor structure may further include a second protection layer 125 located at a bottom surface and a sidewall of the third groove. A bottom surface and a sidewall of the second protection layer 125 are configured to form a fourth groove (not shown in the figure), and a portion of the electrical connection structure 104 is located in the fourth groove. In this way, the second protection layer 125 may be used to prevent the electrical connection pillar 103 in the second groove 122 from being oxidized.

In some embodiments, the material of the electrical connection pillar 103 may be copper. The material of the second protection layer 125 may be nickel. The material of the electrical connection structure 104 may be a silver-tin alloy. Since the lattice constant of nickel is relatively close to the lattice constant of the silver-tin alloy, nickel may be closely connected to the silver-tin alloy. That is, the contact performance between the electrical connection structure 104 and the second protection layer 125 is good, which is beneficial to reduce the interface resistance between the electrical connection structure 104 and the second protection layer 125. In addition, the contact between the electrical connection structure and the second protection layer will not generate a relatively large stress, which is beneficial to further improve the stability of the connection between the electrical connection structure 104 and the second protection layer 125.

In summary, the electrical connection structure 104 and the portion of the electrical connection pillar 103 protruding from the second base 120 are collectively embedded into the first groove 112 of the first base 110, so that the first base 110 and the second base 120 are in an engaged state, which is beneficial to prevent the first base 110 and the second base 120 from sliding relative to each other, thereby improving the stability of the connection between the first base 110 and the second base 120. Moreover, the electrical connection structure 104 surrounds at least a portion of the conductive pillar 101 exposed from the first groove 112 and a portion of the electrical connection pillar 103 embedded into the first groove 112, which is beneficial to increase contact areas between the electrical connection structure 104 and the conductive pillar 101 as well as the electrical connection pillar 103, thereby ensuring good signal transfer efficiency between the first base 110 and the second base 120. In addition, the first surface of the first base 110 and the second surface of the second base 120 are bonded to each other, thus, it is not necessary to add a connection structure with an extra thickness, which is beneficial to reduce material consumption and reduce the overall thickness of the stack bases.

Another embodiment of the disclosure further provides a method for manufacturing a semiconductor structure, which is used to form the semiconductor structure provided in the above embodiments. The semiconductor structure provided in another embodiment of the disclosure will be described in detail below with reference to the accompanying drawings. FIG. 1 to FIG. 14 are schematic diagrams of a structure corresponding to each operation in a method for manufacturing a semiconductor structure according to another embodiment of the disclosure.

With reference to FIG. 1 to FIG. 14, a method for manufacturing a semiconductor structure includes the following operations. A first base 110 with a first surface a is provided, in which a conductive pillar 101 is arranged in the first base 110, the first surface a includes a first groove 112, and the first groove 112 exposes a top surface and a portion of a sidewall of the conductive pillar 101. A second base 120 with a second surface b is provided, in which the second surface b includes a second groove 122. An electrical connection pillar 103 is formed in the second groove 122. An initial electrical connection structure 114 is formed on a side of the electrical connection pillar 103 away from the second base 120. The second surface b including the electrical connection pillar 103 and the initial electrical connection structure 114 is bonded to the first surface a, so as to embed the initial electrical connection structure 114 and a portion of the electrical connection pillar 103 into the first groove 112, and to form an electrical connection structure 104.

For specific operations that the first base 110 is provided, there may be the following three embodiments.

Figure 2:
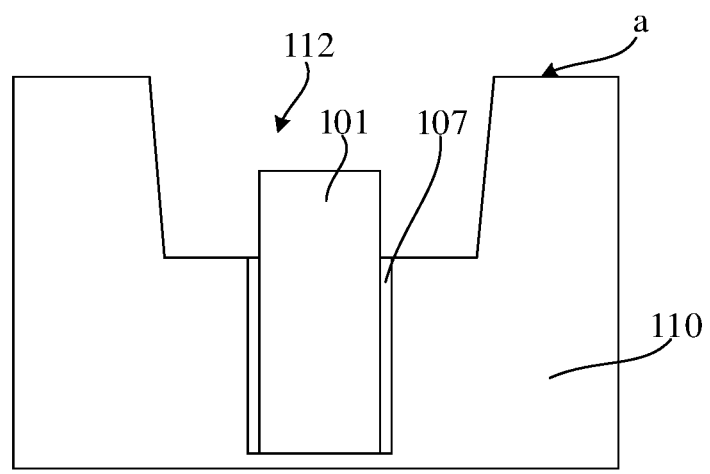

In some embodiments, with reference to FIG. 2, a conductive pillar 101 is arranged in the first base 110, the first surface a includes a first groove 112, and the first groove 112 exposes a top surface and a portion of a sidewall of the conductive pillar 101. Subsequently, the second surface b of the second base 120 including the electrical connection pillar 103 and the initial electrical connection structure 114 (with reference to FIG. 7) may be directly bonded to the first surface a.

In some other embodiments, before the first surface a is bonded to the second surface b, the method for manufacturing the semiconductor structure may further include the following operation. A first protection layer 115 is formed on a surface collectively formed by the conductive pillar 101 and the first groove 112, which is beneficial to prevent the conductive pillar 101 exposed from the first groove 112 from being oxidized. The material of the conductive pillar 101 may be copper. The material of the first protection layer 115 may be nickel. The material of the electrical connection structure 104 may be a silver-tin alloy. Since the lattice constant of nickel is relatively close to the lattice constant of the silver-tin alloy, when the first surface a is bonded to the second surface b, it is beneficial to improve the adhesion between the electrical connection structure 104 and the first protection layer 115, which is further beneficial to reduce the interface resistance between the electrical connection structure 104 and the first protection layer 115. In addition, the contact between the electrical connection structure and the first protection layer will not generate a relatively large stress, which is beneficial to further improve the stability of the connection between the electrical connection structure 104 and the first protection layer 115.

Figure 3:
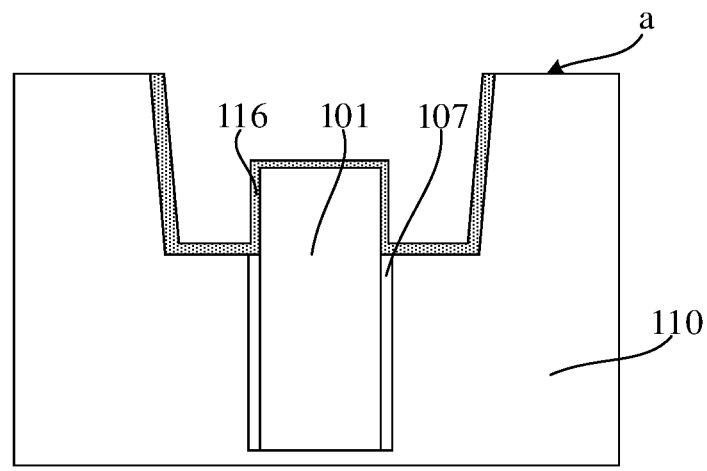
Figure 4:
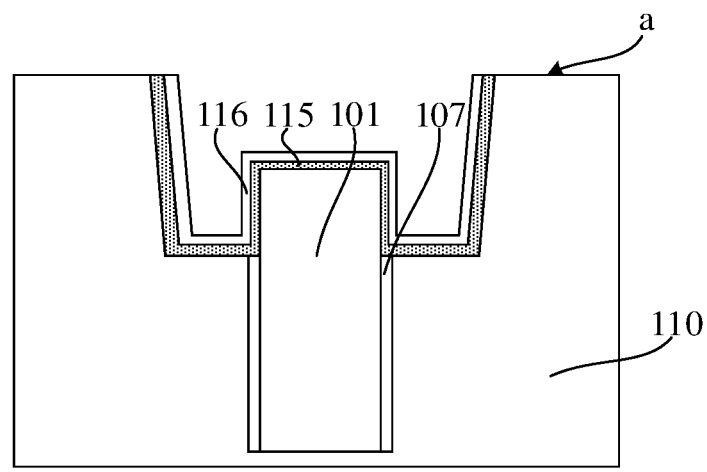

In still some other embodiments, before the first surface a is bonded to the second surface b (with reference to FIG. 5), the method for manufacturing the semiconductor structure may further include the following operation. With reference to FIG. 3, a first seed layer 116 is formed on a surface collectively formed by the conductive pillar 101 and the first groove 112. With reference to FIG. 4, a first protection layer 115 is formed on a surface of the first seed layer 116.

The material of the first seed layer 116 may be copper. The material of the first protection layer 115 may be a metal material, such as nickel, gold or silver. The material type of the first base 110 may be an elemental semiconductor material or a crystalline inorganic compound semiconductor material. When the first seed layer 116 is firstly formed on the surface of the first groove 112 and then the first protection layer 115 is formed, the first protection layer 115 may continue to grow based on the lattice arrangement in the first seed layer 116, so as to improve the matching degree between the lattice constant of the first protection layer 115 and the lattice constant of the first seed layer 116, which is beneficial to reduce the defect density in the first protection layer 115, improve the film layer quality of the first protection layer 115, and reduce the internal stress of the first protection layer 115. Therefore, it is beneficial to improve the adhesion between the first seed layer 116 and the first base 110 as well as the first protection layer 115, thereby eventually improving the stability of the connection between the first base 110 and the second base 120.

In some embodiments, the method for forming the first seed layer 116 may be physical vapor deposition, and the method for forming the first protection layer 115 may be electroplating.

In the above three embodiments, an isolation layer 107 may be further provided between the conductive pillar 101 and the first base 110. The material of the conductive pillar 101 may be copper. The material of the isolation layer 107 may be silicon oxide.

Figure 5:
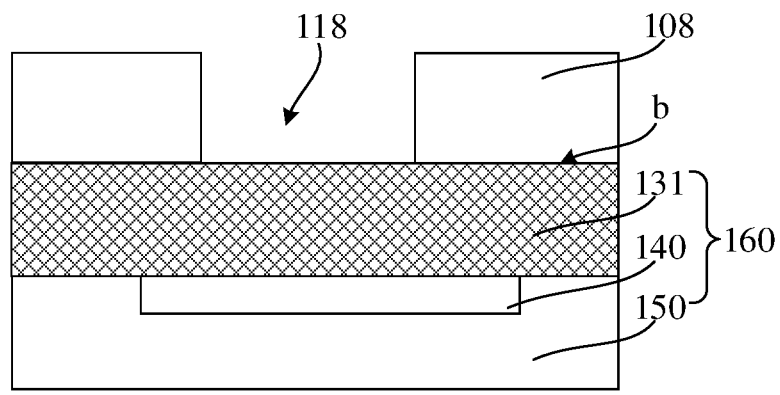

In some embodiments, with reference to FIG. 5, the operation that the second base 120 is provided includes the following operation. An initial second base 160 is provided. A mask layer 108 with an opening 118 is formed on a surface of a side of the initial second base 160.

The initial second base 160 may include an initial dielectric layer 131, a conductive layer 140, and a substrate 150. The material of the initial dielectric layer 131 may be an insulating material with a relatively high relative dielectric constant, such as silicon oxide, silicon nitride or silicon oxynitride. The material of the conductive layer 140 and the material of the substrate 150 are the same as those in the above embodiments, which is not repeated herein. The material of the mask layer 108 may be a photoresist.

Figure 6:
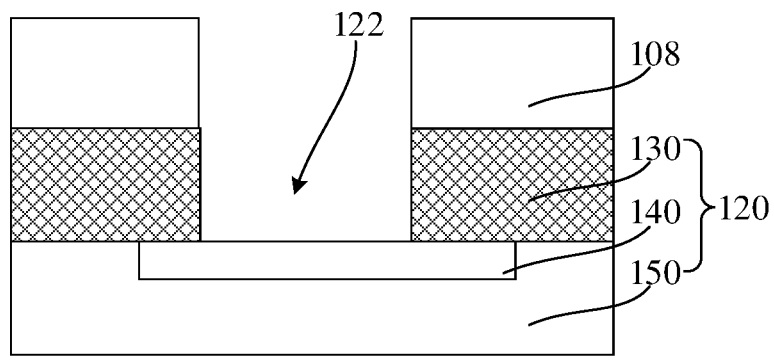

With reference to FIG. 5 and FIG. 6, the initial second base 160 is etched by using the mask layer 108 as a mask, so as to form the second base 120 with the second groove 122. The remaining portion of the initial dielectric layer 131 serves as the dielectric layer 130. The second groove 122 penetrates through the dielectric layer 130. The dielectric layer 130 is configured to protect the substrate 150 and the conductive layer 140, so as to prevent the substrate 150 and the conductive layer 140 from contacting the unnecessary structures, thereby avoiding adverse impact on the performance of the semiconductor structure. The conductive layer 140 is located in the substrate 150, and the second groove 122 exposes a portion of the surface of the conductive layer 140. The conductive layer 140 is configured to realize the electrical connection between the electrical connection pillar 103 and other electrical devices in the second base. It should be noted that the situation that the second groove 122 only penetrates through the dielectric layer 130 is taken as an example in FIG. 6. In practical applications, the second groove 122 may also penetrate through a portion of the thickness of the conductive layer 140.

The specific operation of forming the electrical connection pillar 103 and the initial electrical connection structure 114 will be described in detailed below with reference to three embodiments.

Figure 7:
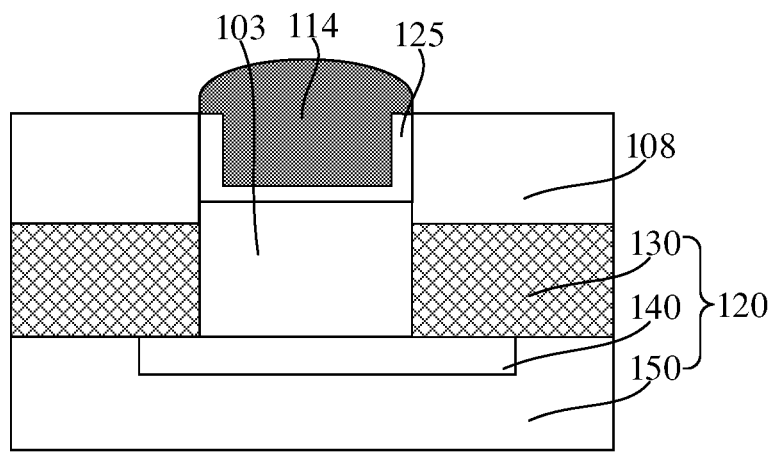

In some embodiments, with reference to FIG. 7, the electrical connection pillar 103 is formed in the second groove 122 (with reference to FIG. 6) and the opening 118 (with reference to FIG. 5). The second groove 122 is completely filled with the electrical connection pillar 103, and the electrical connection pillar is located in a portion of the opening 118.

Next, with reference to FIG. 7, the second protection layer 125 is formed in a groove formed by the sidewall of the opening 118 and the top surface of the electrical connection pillar 103. The initial electrical connection structure 114 is formed in a groove formed by the second protection layer 125. A top surface of the initial electrical connection structure 114 away from the electrical connection pillar 103 is higher than a top surface of the mask layer 108 away from the second base 120. In other embodiments, the second protection layer may be not formed, but directly forming the initial electrical connection structure in the groove formed by the sidewall of the opening and the top surface of the electrical connection pillar.

Figure 8:
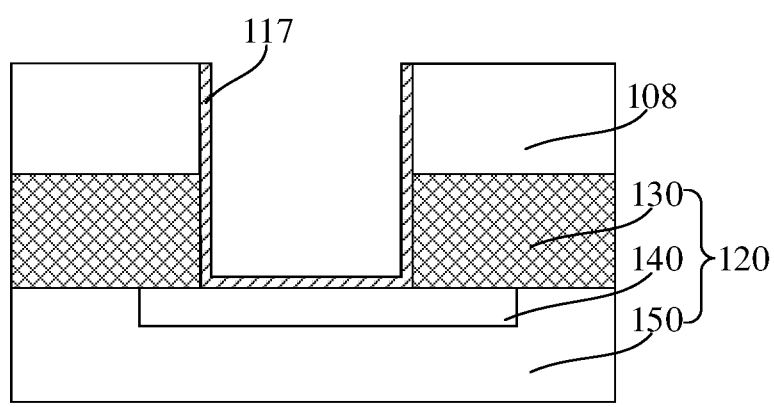

In some other embodiments, with reference to FIG. 8, before the electrical connection pillar 103 is formed, the method for manufacturing the semiconductor structure may further include the following operation. A diffusion barrier layer 117 is formed at a bottom portion and a sidewall of the second groove 122 (with reference to FIG. 6) and a sidewall of the opening 118 (with reference to FIG. 5). It should be noted that the material and function of the diffusion barrier layer 117 are the same as those in the above embodiments, which is not repeated herein. The method for forming the diffusion barrier layer 117 includes physical vapor deposition.

Figure 9:
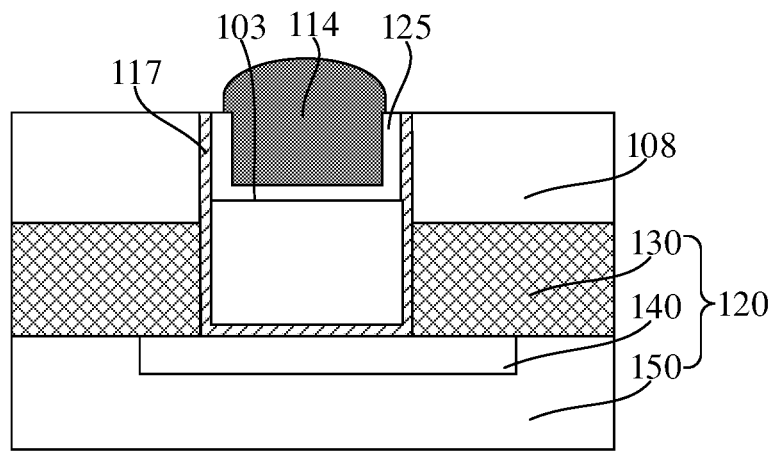

With reference to FIG. 9, the electrical connection pillar 103 is formed on the diffusion barrier layer 117.

With reference to FIG. 9, the top surface of the electrical connection pillar 103 and a portion of the diffusion barrier layer 117 which is not in contact with the electrical connection pillar 103 are configured to form a third groove (not shown in the figure). After the electrical connection pillar 103 is formed, and before the initial electrical connection structure 114 is formed, the method for manufacturing the semiconductor structure may further include the following operation. A second protection layer 125 is formed at a bottom surface and a sidewall of the third groove.

With reference to FIG. 9, a bottom surface and a sidewall of the second protection layer 125 are configured to form a fourth groove (not shown in the figure). The operation that the initial electrical connection structure 114 is formed includes the following operation. The initial electrical connection structure 114 is formed in the fourth groove, in which a top surface of the initial electrical connection structure 114 away from the electrical connection pillar 103 is higher than a top surface of the mask layer 108 away from the second base 120.

In other embodiments, the second protection layer may be not formed, but directly forming the initial electrical connection structure in the groove formed by the sidewall of the diffusion barrier layer and the top surface of the electrical connection pillar.

Figure 10:
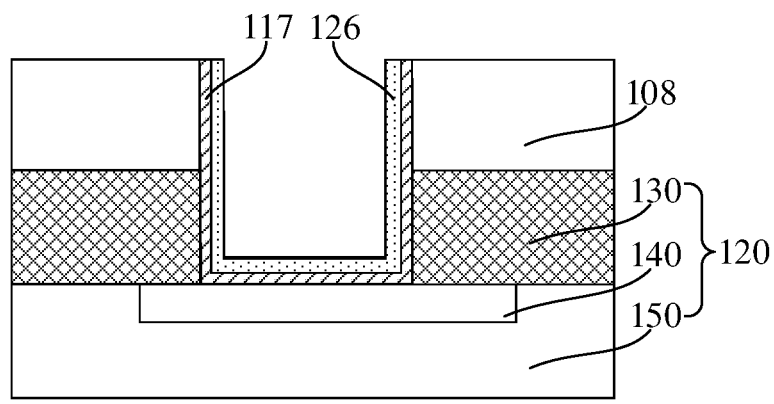

In still some other embodiments, with reference to FIG. 10, after the diffusion barrier layer 117 is formed, and before the electrical connection pillar 103 is formed, the method for manufacturing the semiconductor structure may further include the following operation. A second seed layer 126 is formed on a surface of the diffusion barrier layer 117. The material and function of the second seed layer 126 are the same as those in the above embodiments, which is not repeated herein. The methods for forming the diffusion barrier layer 117 and the second seed layer 126 include physical vapor deposition.

Figure 11:
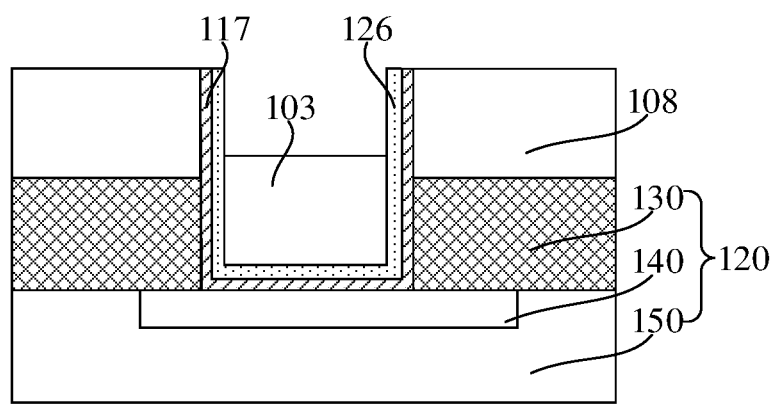

With reference to FIG. 11, the electrical connection pillar 103 is formed in the groove formed by the second seed layer 126. The second seed layer 126 and the electrical connection pillar 103 may be made of a metal material. The electrical connection pillar 103 may continue to grow based on the lattice arrangement in the second seed layer 126, so as to increase the matching degree between the lattice constant of the electrical connection pillar 103 and the lattice constant of the second seed layer 126, which is beneficial to reduce the defect density in the electrical connection pillar 103, improve the film layer quality of the electrical connection pillar 103, and reduce the internal stress of the electrical connection pillar 103. Therefore, it is beneficial to improve the adhesion between the second seed layer 126 and the diffusion barrier layer 117 as well as the electrical connection pillar 103, thereby eventually improving the stability of the connection between the first base 110 and the second base 120.

Figure 12:
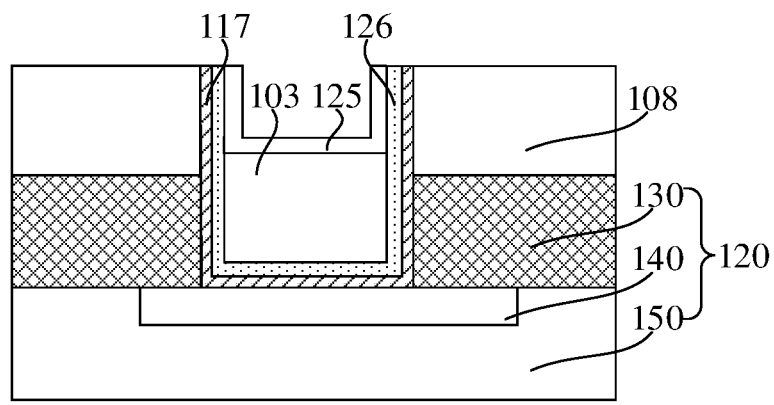

With reference to FIG. 12, the top surface of the electrical connection pillar 103 and a portion of the second seed layer 126, which is not in contact with the electrical connection pillar 103 are configured to form a third groove (not shown in the figure). After the electrical connection pillar 103 is formed, and before the initial electrical connection structure 114 is formed, the method for manufacturing the semiconductor structure may further include the following operation. A second protection layer 125 is formed at a bottom surface and a sidewall of the third groove. The methods for forming the electrical connection pillar 103 and the second protection layer 125 include electroplating.

Figure 13:
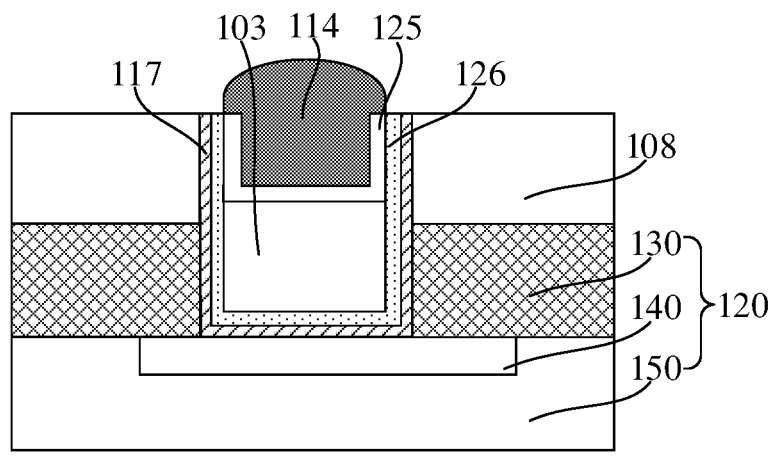

With reference to FIG. 13, a bottom surface and a sidewall of the second protection layer 125 are configured to form a fourth groove. The operation that the initial electrical connection structure 114 is formed may include the following operation. The initial electrical connection structure 114 is formed in the fourth groove, in which a top surface of the initial electrical connection structure 114 away from the electrical connection pillar 103 is higher than a top surface of the mask layer 108 away from the second base 120.

In other embodiments, the second protection layer may be not formed, but directly forming the initial electrical connection structure in the groove formed by the sidewall of the second seed layer and the top surface of the electrical connection pillar.

Figure 14:
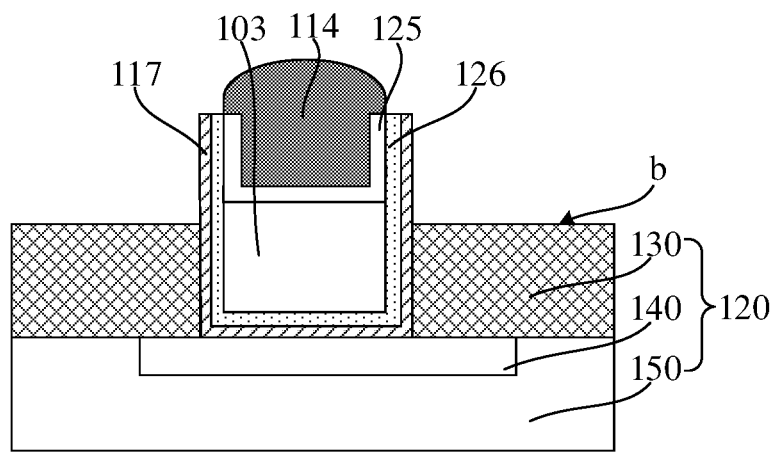

With reference to FIG. 14, the mask layer 108 is removed to prepare for the bonding between the first surface a and the second surface b (with reference to FIG. 4). It should be noted that in the above two other embodiments, the mask layer 108 will also be eventually removed.

In the above three embodiments, the material of the electrical connection pillar 103 may be copper. The material of the second protection layer 125 may be nickel. The material of the initial electrical connection structure 114 may be a silver-tin alloy. Since the lattice constant of nickel is relatively close to the lattice constant of the silver-tin alloy, the initial electrical connection structure 114 formed on the second protection layer 125 has high quality and low internal stress, which is beneficial to improve the contact performance between the electrical connection structure 104 and the second protection layer 125, and to reduce the interface resistance between the electrical connection structure 104 and the second protection layer 125, thereby further improving the stability of the connection between the electrical connection structure 104 and the second protection layer 125.

In addition, in the above three embodiments, in the direction X from the first surface a to the second surface b, a ratio of a height of the electrical connection pillar 103 located in the opening 118 to a height of the mask layer 108 ranges from 1/5 to 1/3. If the ratio of the height of the electrical connection pillar 103 located in the opening 118 to the height of the mask layer 108 is less than 1/5, the volume of the electrical connection pillar 103 is relatively small, which is not conducive to improving the conductivity of the electrical connection pillar 103. If the ratio of the height of the electrical connection pillar 103 located in the opening 118 to the height of the mask layer 108 is greater than 1/3, when the mask layer 108 is subsequently removed or the first surface a is bonded to the second surface b, the electrical connection pillar 103 is prone to fracture, which is not conducive to the yield of the semiconductor structure. In addition, when the second surface b is bonded to the first surface a, the initial electrical connection structure 114 may spread into the first groove 112 under the influence of temperature and pressure, and the diffusion barrier layer 117, the second protection layer 125, and the second seed layer 126 have a certain guiding effect for the spread of the initial electrical connection structure 114 into the first groove 112, which is beneficial to reduce the probability that the initial electrical connection structure 114 overflows from the first groove 112, so as to further improve the stability of the connection of the stack bases.

It should be noted that with reference to FIG. 14, FIG. 9, and FIG. 1, when the second surface b including the electrical connection pillar 103 and the initial electrical connection structure 114 is bonded to the first surface a, the initial electrical connection structure 114 deforms under the influence of the temperature and pressure, so as to form the electrical connection structure 104 shown in FIG. 1. In practical applications, the diffusion barrier layer 117, the second protection layer 125, and the second seed layer 126 may also deform under the influence of the temperature and pressure, so as to spread into the first groove 112.

In summary, the first base 110 with the first groove 112 and the second base 120 with the electrical connection pillar 103 and the initial electrical connection structure 114 are provided. When the first surface a is bonded to the second surface b, the initial electrical connection structure 114 and a portion of the electrical connection pillar 103 are collectively embedded into the first groove 112, so that the first base 110 and the second base 120 are in an engaged state, which is beneficial to prevent the first base 110 and the second base 120 from sliding relative to each other, thereby improving the stability of the connection between the first base 110 and the second base 120. Moreover, the eventually formed electrical connection structure 104 surrounds at least a portion of the conductive pillar 101 exposed from the first groove 112 and a portion of the electrical connection pillar 103 embedded into the first groove 112, which is beneficial to increase contact areas between the electrical connection structure 104 and the conductive pillar 101 as well as the electrical connection pillar 103, thereby ensuring good signal transfer efficiency between the first base 110 and the second base 120. In addition, the first surface of the first base 110 and the second surface of the second base 120 are bonded to each other, and it is not necessary to add a connection structure with an extra thickness, which is beneficial to reduce material consumption and reduce the overall thickness of the stack bases.

Those of ordinary skill in the art may understand that the above embodiments are specific embodiments to implement the disclosure. In practical applications, various changes may be made in forms and details without departing from the spirit and scope of the embodiments of the disclosure. Any person skilled in the art may make changes and modifications without departing from the spirit and scope of the embodiments of the disclosure. Therefore, the protection scope of the embodiments of the disclosure should be subjected to the scope defined by the appended claims.

The invention claimed is:

1. A semiconductor structure, comprising:
    a first base with a first surface, wherein a conductive pillar is arranged in the first base, the first surface comprises a first groove, and the first groove exposes a top surface and a portion of a sidewall of the conductive pillar;
    a second base with a second surface, wherein the first surface is bonded to the second surface, the second surface comprises a second groove, an electrical connection pillar is arranged in the second base, the second groove is completely filled with the electrical connection pillar, and the electrical connection pillar protrudes from the second surface; and
    an electrical connection structure, wherein the electrical connection structure and a portion of the electrical connection pillar are embedded into the first groove, and the electrical connection structure surrounds a portion of the conductive pillar exposed from the first groove and the portion of the electrical connection pillar embedded into the first groove.

2. The semiconductor structure according to claim 1, wherein
    in a plane perpendicular to a direction from the first surface to the second surface, a cross-sectional area of the electrical connection pillar is greater than a cross-sectional area of the conductive pillar.

3. The semiconductor structure according to claim 2, wherein
a ratio of the cross-sectional area of the electrical connection pillar to the cross-sectional area of the conductive pillar ranges from 2 to 5.

4. The semiconductor structure according to claim 1, wherein
in a direction perpendicular to a direction from the first surface to the second surface, a ratio of a width of the first groove to a width of the conductive pillar ranges from 2 to 3.

5. The semiconductor structure according to claim 1, wherein
the electrical connection structure is located between the electrical connection pillar and the conductive pillar.

6. The semiconductor structure according to claim 1, further comprising
a first protection layer located between the electrical connection structure and a surface collectively formed by the conductive pillar and the first groove.

7. The semiconductor structure according to claim 6, further comprising
a first seed layer located between the first protection layer and the surface collectively formed by the conductive pillar and the first groove.

8. The semiconductor structure according to claim 1, further comprising
a diffusion barrier layer located between an inner surface of the second groove and the electrical connection pillar, wherein a top surface of the diffusion barrier layer is higher than a top surface of the electrical connection pillar.

9. The semiconductor structure according to claim 8, further comprising
a second seed layer located between the diffusion barrier layer and the electrical connection pillar, wherein a top surface of the second seed layer is flush with or lower than the top surface of the diffusion barrier layer.

10. The semiconductor structure according to claim 8, wherein
the top surface of the electrical connection pillar and a portion of the diffusion barrier layer which is not in contact with the electrical connection pillar are configured to form a third groove.

11. The semiconductor structure according to claim 10, further comprising
a second protection layer located at a bottom surface and a sidewall of the third groove, wherein a bottom surface and a sidewall of the second protection layer are configured to form a fourth groove, and a portion of the electrical connection structure is located in the fourth groove.

12. A method for manufacturing a semiconductor structure, comprising:
providing a first base with a first surface, wherein a conductive pillar is arranged in the first base, the first surface comprises a first groove, and the first groove exposes a top surface and a portion of a sidewall of the conductive pillar;
providing a second base with a second surface, wherein the second surface comprises a second groove;
forming an electrical connection pillar in the second groove;
forming an initial electrical connection structure on a side of the electrical connection pillar away from the second base; and
bonding the second surface comprising the electrical connection pillar and the initial electrical connection structure to the first surface, to embed the initial electrical connection structure and a portion of the electrical connection pillar into the first groove and to form an electrical connection structure;
wherein
providing the second base comprises:
providing an initial second base;
forming a mask layer with an opening on a surface of a side of the initial second base; and
etching the initial second base by using the mask layer as a mask to form the second base with the second groove;
wherein
forming the electrical connection pillar comprises forming the electrical connection pillar in the second groove and the opening, wherein the second groove is completely filled with the electrical connection pillar, and the electrical connection pillar is located in a portion of the opening.

13. The method for manufacturing the semiconductor structure according to claim 12, wherein
before bonding the second surface to the first surface, the method further comprises forming a first protection layer on a surface collectively formed by the conductive pillar and the first groove.

14. The method for manufacturing the semiconductor structure according to claim 12, wherein
before bonding the second surface to the first surface, the method further comprises: forming a first seed layer on a surface collectively formed by the conductive pillar and the first groove; and forming a first protection layer on a surface of the first seed layer.

15. The method for manufacturing the semiconductor structure according to claim 12, wherein
in a direction from the first surface to the second surface, a ratio of a height of the electrical connection pillar located in the opening to a height of the mask layer ranges from 1/5 to 1/3.

16. The method for manufacturing the semiconductor structure according to claim 12, wherein
before forming the electrical connection pillar, the method further comprises forming a diffusion barrier layer at a bottom portion and a sidewall of the second groove and a sidewall of the opening.

17. The method for manufacturing the semiconductor structure according to claim 16, wherein
after forming the diffusion barrier layer, and before forming the electrical connection pillar, the method further comprises forming a second seed layer on a surface of the diffusion barrier layer.

18. The method for manufacturing the semiconductor structure according to claim 16, wherein
a top surface of the electrical connection pillar and a portion of the diffusion barrier layer which is not in contact with the electrical connection pillar are configured to form a third groove, and wherein after forming the electrical connection pillar, and before forming the initial electrical connection structure, the method further comprises forming a second protection layer at a bottom surface and a sidewall of the third groove.

* * * * *